US006020790A

United States Patent [19]
Jackson et al.

[11] Patent Number: 6,020,790
[45] Date of Patent: Feb. 1, 2000

[54] OSCILLATOR CALIBRATION METHOD AND CIRCUIT AND RADIO WITH OSCILLATOR

[75] Inventors: Irvin R. Jackson, Schaumburg, Ill.; Paul Linsay, Newton, Mass.; Thomas A. Freeburg, Arlington Heights, Ill.

[73] Assignee: Motorola, Inc., Schaumburg, Ill.

[21] Appl. No.: 09/126,637

[22] Filed: Jul. 30, 1998

[51] Int. Cl.[7] .............................. G01R 23/00; H03B 5/24; H03L 7/00

[52] U.S. Cl. .................................. 331/44; 331/47; 331/51; 331/54; 331/55; 331/111; 331/143; 331/153; 331/172; 331/179; 455/67.1; 455/75; 455/119; 455/226.1; 455/257

[58] Field of Search ................................... 331/44, 47, 50, 331/51, 54, 55, 111, 143, 153, 172, 179; 455/63, 67.1–67.7, 73, 75, 91, 119, 226.1–226.4, 255, 257

[56] References Cited

U.S. PATENT DOCUMENTS 4,347,484  8/1982  Vandegraaf ................................ 331/25

OTHER PUBLICATIONS

Brailove, Adam A., "The Dynamics of Two Pulse–Coupled Relaxation Oscillators", International Journal of Bifurcation and Chaos, vol. 2, No. 2, (1992), p. 341–352.

Alstrom, P., Christiansen, B., Levinsen, M., "Nonchaotic transition from Quasiperodicity to Complete Phase Locking", Physical Review Letters, vol. 61, No. 15, (1988), p. 1679–1682.

Brailove, Adam A., Linsay, Paul S., "An Experimental Study of a Population of Relaxation Oscillators with a Phase–Repelling Mean–Field Coupling", International Journal of Bifurcation and Chaos, vol. 6, No. 7, (1996), p. 1211–1253.

Primary Examiner—David Mis
Attorney, Agent, or Firm—Hugh C. Dunlop

[57] ABSTRACT

In a method of calibration of a voltage controlled oscillator (VCO), the VCO (100) provides an output signal which is used to drive a dividing oscillator (10) such as a relaxation oscillator (RO). The RO has at least two states, one in which the RO provides an output signal which has a first frequency that is related to the VCO output signal by a first ratio (e.g. 1/N) and one in which the relaxation oscillator provides a RO output signal which has a second frequency that is related to the VCO output signal by a second ratio (e.g. 1/(N+1)). By measuring the first and second frequencies (and knowing the relationship between the first and second ratios), the VCO frequency is calculated and stored (110). Several VCO frequencies can be calculated and stored for several applied voltages. As a result the VCO can be driven to any selected frequency in the calibrated range and can be used to provide an injection frequency for a radio.

17 Claims, 5 Drawing Sheets

6,020,790

OSCILLATOR CALIBRATION METHOD AND CIRCUIT AND RADIO WITH OSCILLATOR

FIELD OF THE INVENTION

This invention relates to a method of calibration of an oscillator, for example, a voltage controlled oscillator (VCO) and it relates to apparatus for performing such calibration. The calibration and method and apparatus are particularly useful in controlling an oscillator for a radio and the invention extends to a radio incorporating such an oscillator.

BACKGROUND OF THE INVENTION

In the field of radio receivers and transmitters, it is common to provide a synthesizer that delivers a selectable frequency for down converting a received radio frequency (RF) signal to an intermediate frequency (IF) or to base band and similarly it is common to use a synthesizer for up converting a base band signal (audio or data) to an IF signal and to an RF signal. A synthesizer typically comprises a VCO and a phase locked loop. The phase locked loop incorporates a divider and by loading an appropriate divisor into the divider, the VCO frequency is divided to a desired injection frequency for the IF stage. In this manner, many different IF frequencies can be selected corresponding to different radio channels. For example, in a narrow band radio telephone, radio channels are typically separated at 25 KHz spacings and it is necessary to tune the receiver and transmitter to a number of different 25 KHz channels across a wide range.

A synthesizer is a particularly expensive element of a radio. Significant effort is directed towards eliminating the need for a synthesizer, but no satisfactory method has yet been devised that eliminates the cost of the synthesizer while still allowing an acceptable level of accuracy in tuning of an injection oscillator signal.

There is a need for an improved method of provision of an oscillator signal that is selectable over a wide range and is setable to a high degree of tolerance over different frequencies across the range. There is a need for a low cost solution that is significantly less expensive than existing solutions.

DETAILED DESCRIPTION OF THE DRAWINGS

Figure 1:
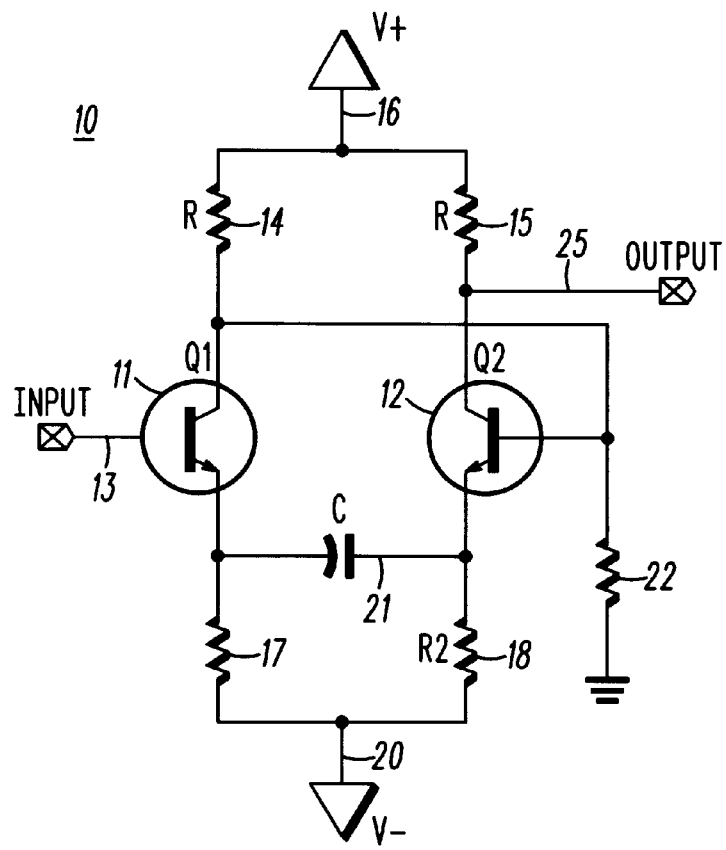
FIG. 1 is a circuit diagram of a common relaxation oscillator.

FIG. 1 illustrates a simple relaxation oscillator (RO) that is well known in the literature. It comprises a first NPN transistor 11 and a second NPN transistor 12. The base of the first transistor 11 is the input 13 of the oscillator. The collectors of the transistors are coupled by resistors 14 & 15 to a positive voltage supply 16. The emitters of the transistors are coupled by resistors 17 & 18 to a negative voltage supply 20. A capacitor 21 is connected between the emitters of the transistors 11 & 12. The collector of transistor 11 and the base of transistor 12 are connected by a resistor 22 to ground. The junction between the collector of transistor 12 and the resistor 15 is the output 25 of the relaxation oscillator.

With the input 13 held at a constant voltage, the capacitor 21 will charge at an approximately constant rate through transistor 12 and the voltage of the output 25 will rise, until a threshold value is reached at which transistor 11 conducts, causing the capacitor 21 to discharge through transistor 11. This cycle repeats in a continuous cycle at a frequency that is dependent on the size of the capacitor and the various resistor values.

Figure 2:
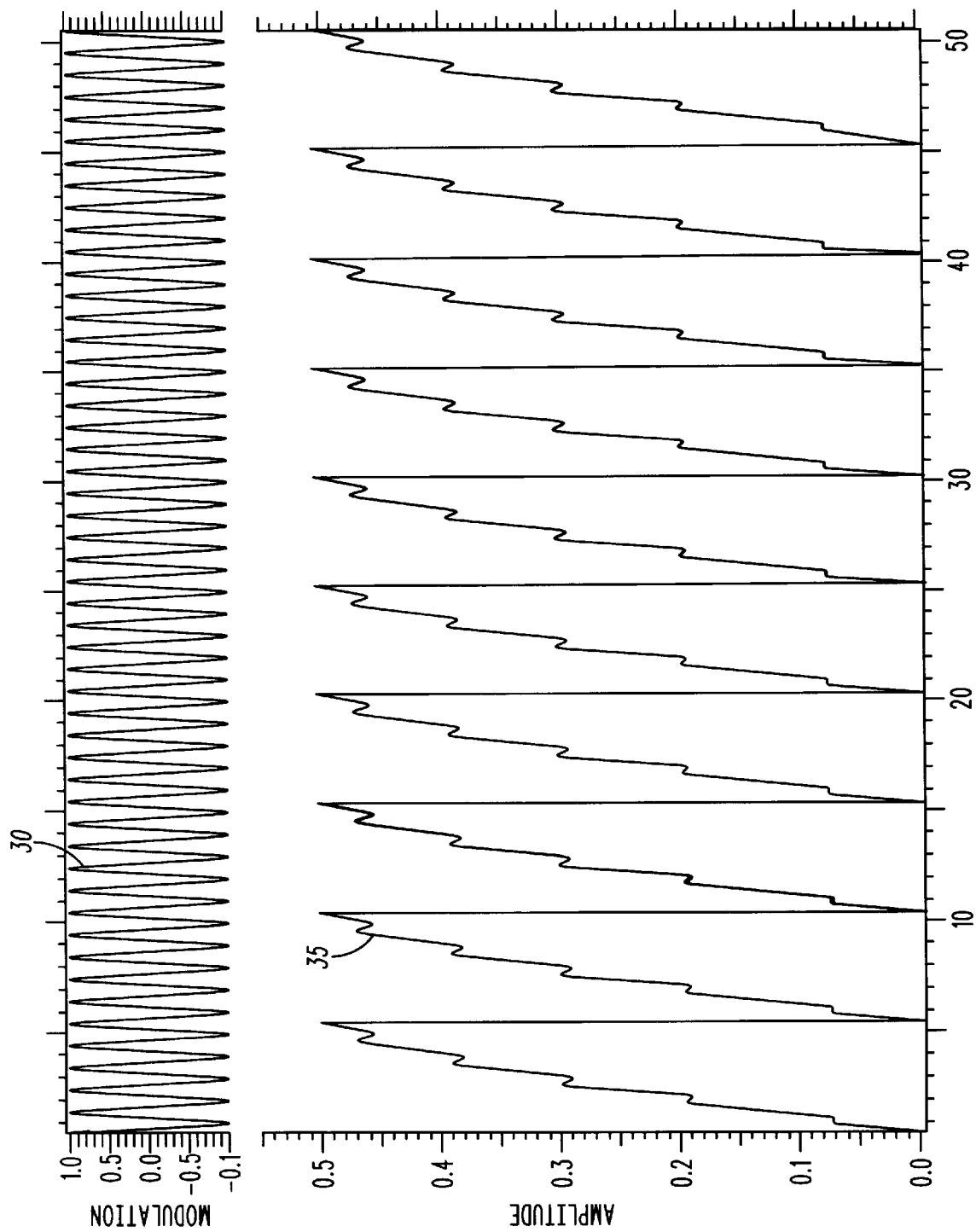
FIG. 2 is a time diagram illustrating the operation of the oscillator of FIG. 1 in response to an oscillating input.

When a driving frequency is applied to the input 13, the behavior of the relaxation oscillator is as illustrated in FIG. 2. At the top of FIG. 2 there is shown a sinusoidal driving oscillator signal 30 applied to the input of the relaxation oscillator. At the bottom of FIG. 2 there is shown a resultant signal 35 on the output 25 on the relaxation oscillator. The output rises in steps with each cycle of the driving oscillator signal until the threshold voltage (in this case 0.5 volts) is reached, whereupon the output signal rapidly falls to zero volts. FIG. 2 in particular illustrates that there is a stable situation in which the output signal falls at the same time in each Nth cycle of the driving oscillator signal. As a result, the relaxation oscillator is performing the function of a divide-by-N circuit. The output frequency of the relaxation oscillator is exactly equal to the input frequency divided by N. In the illustrated example, N=5.

Figure 3:
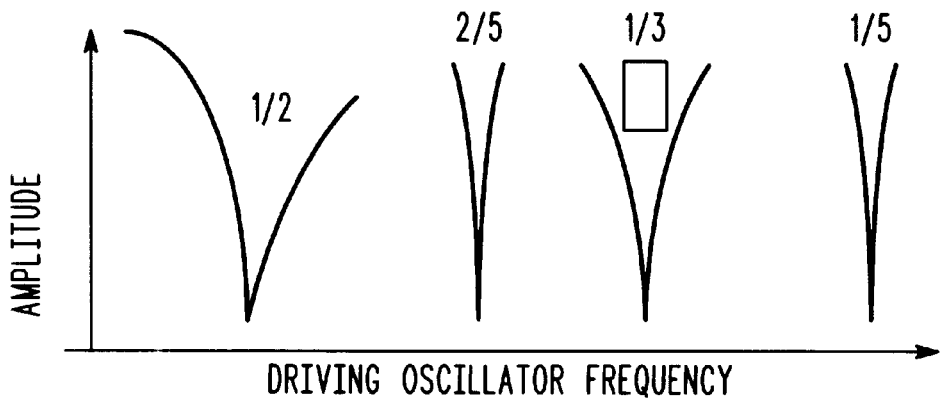
FIG. 3 is a frequency-coupling characteristic for the oscillator of FIG. 1 with different driving oscillator frequencies.

The frequency ratio of the two locked oscillators is given by a rational number P/Q where P & Q are relatively prime. The range over which locking occurs with this frequency ratio depends on the amplitude and frequency of the driving oscillator. Schematically, the locking regions have a structure like that of FIG. 3. FIG. 3 shows tongues known as A'rnold tongues as are described in P. Alstrøm, B. Christiansen and M. T. Levinsen (1998), "Nonchaotic Transition from Quasiperiodicity to Complete Phase Locking", Physical Review Letters vol. 61 No. 1697–1682. The width of a tongue is determined by the amplitude of the driving oscillator signal and P/Q is determined by the frequency of the driving oscillator and the free running frequency of the RO. At a fixed driving oscillator amplitude the tongue widths are approximately proportional to 1/Q. As a result, high order lockings, i.e., Q large, have very narrow tongues making them difficult to locate and sensitive to the stability of the driving frequency and the coupling. In this case, a slight error in operating parameters will result in a locking ratio P'/Q' that is close to but not exactly equal to P/Q. As long as the driving oscillator amplitude and frequency lie within a tongue, the dividing ratio is fixed.

Ideally, the amplitude and frequency of the driving oscillator are set so that the driving oscillator signal lies within a region 25 in the upper part of a tongue. This region has the advantage of high tolerance for the driving oscillator frequency and so is less subject to electrical component tolerances.

The observed behavior of a relaxation oscillator when subjected to a driving oscillator can be used to advantage in determining the frequency of the driving oscillator. What follows is a description of the method of use of the relaxation oscillator in calibrating a reference oscillator (for example a voltage controlled oscillator) and a circuit in which a relaxation oscillator is incorporated with a reference oscillator and a processor for accurately deriving a desired frequency from the reference oscillator.

Figure 4:
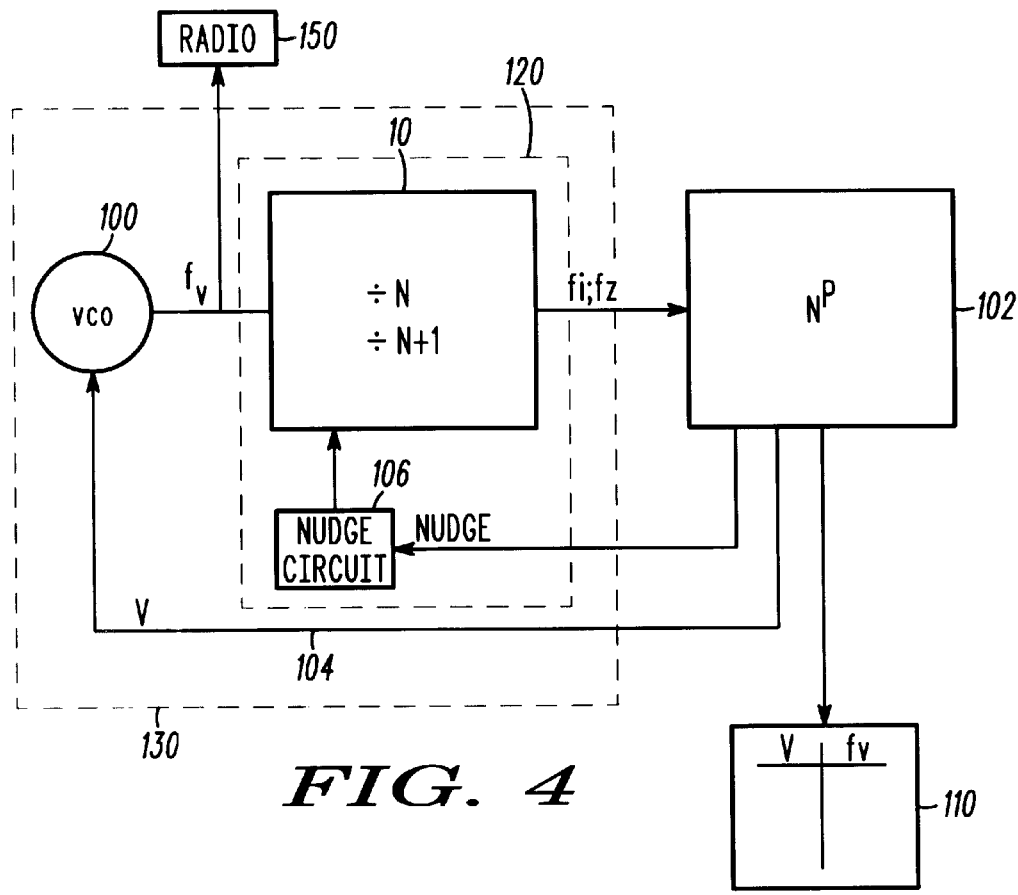
FIG. 4 is a circuit diagram of a circuit implementing the preferred embodiment of the invention.

Referring to FIG. 4, the relaxation oscillator 10 is shown with a voltage controlled oscillator (VCO) 100 connected to the input of the relaxation oscillator and a microprocessor (or digital signal processor) 102 connected to the output. There is a voltage control line 104 extending from the microprocessor 102 to the VCO 100 (via a digital-to-converter which is not shown). The relaxation oscillator 10 has an associated nudge circuit 106 connected to the microprocessor 102. The nudge circuit is preferably a simple bias selection circuit. Also shown in the figure is a memory 110 that is capable of storing a table. In operation the memory 110 stores a table of voltage and frequency values. The memory 110 can be a random access memory and more preferably is an electrically erasable programmable read only memory (EEPROM).

In outline terms, the operation of the circuit of FIG. 4 involves the VCO 100 providing a driving voltage fv to the input of the relaxation oscillator 10. The relaxation oscillator 10 is set to a tongue at which it performs the function of dividing the input frequency by a value N. The resultant divided frequency, f1 is measured by the microprocessor 102. The microprocessor 102 counts the time between threshold crossings on its input to determine the period of the signal f1 and hence the frequency. The microprocessor temporarily stores the measured value and causes the nudge circuit 106 to make a small adjustment to the relaxation oscillator to cause the relaxation oscillator to move to an adjacent tongue at which the relaxation oscillator performs the function of dividing by a value N+1. The microprocessor now measures the frequency f2 which is equal to the frequency fv/N+1 and it stores the measured frequency. From the two measured frequencies and knowing the relationship between the two divisors (without knowing the value N) it is possible to calculate N and, moreover, to calculate fv. As a result, fv can be measured and calculated to a high degree of accuracy. The value V and the value fv are stored by the microprocessor in the table in memory 110.

In a preferred embodiment of the invention, the dividing oscillator 10 and the nudge circuit 106 are integrated into a single integrated circuit 120. For higher integration, the dividing oscillator 10, the nudge circuit 106 and the VCO are all integrated into a single integrated circuit 130.

Figure 5:
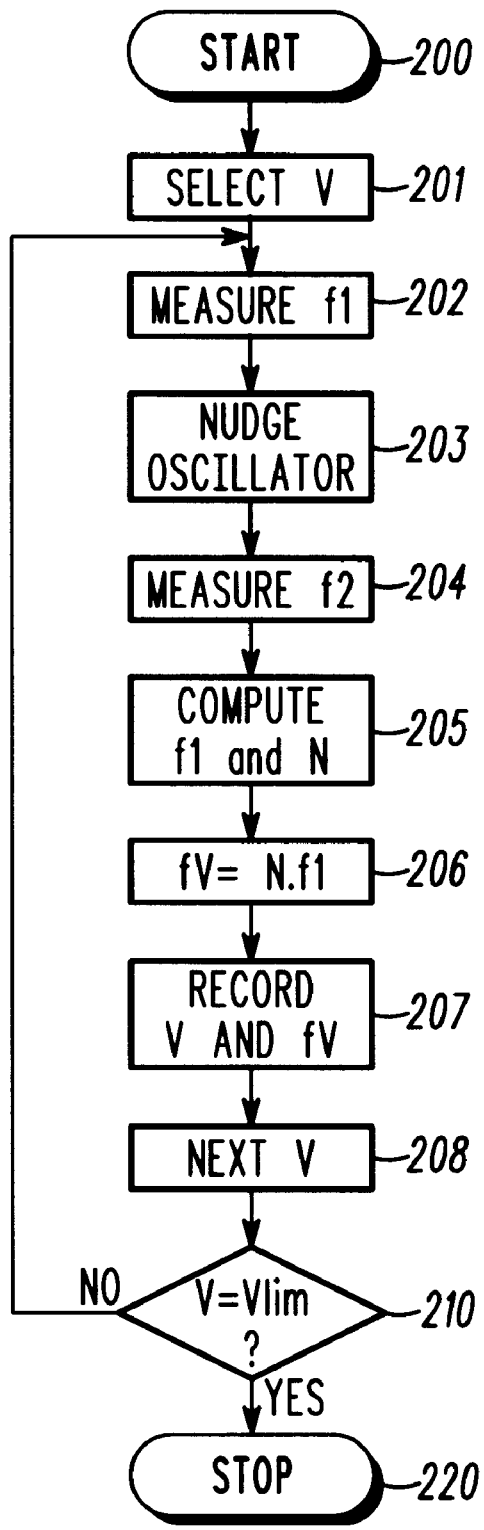
FIG. 5 is a flow diagram illustrating a process performed by the microprocessor of FIG. 4.

The method of operation of the circuit of FIG. 4 is illustrated in more detail in FIG. 5. FIG. 5 is a flow diagram illustrating a computer program carried out by the microprocessor 102.

The program begins at step 200 and in step 201, a value v is selected to drive the VCO 100. In step 202, the frequency f1 is measured at the output 25 of the relaxation oscillator 10. In step 203, the microprocessor 102 causes the relaxation oscillator 10 to move from one notch of the characteristic of FIG. 3 to an adjacent notch and in step 204 the resultant output frequency f2 on the output 25 is measured by the microprocessor 102.

In the preferred embodiment the relaxation oscillator operates in the first state to divide by N and in the second state to divide by N+1. Although FIG. 3 does not show two adjacent notches in which the divisor (denominator) is incremented from one notch to the next and in which the numerator is constant, two such adjacent notches can readily be found at driving oscillator frequencies slightly higher than those shown in FIG. 3, where N is in the range 3–100 and more preferably in the range 20–40, for example 31 or 32. By setting the relaxation oscillator to two states in which there is a known relationship between the input/output frequency ratio in the first state and the input/output frequency ratio in the second state, it is possible to compute f1.

As an example, a 5.2 GHz signal could reasonably be divided by 32 resulting in a frequency of 162.5 MHz which is easily measurable by a frequency counter as part of a radio digital signal processor with an accumulator circuit counting a count rate of, for example, 700 MHz. In the example where the first state provides a division factor N and the second state provides a division factor N+1, f1 and N can be computed by the following simple calculation.

Clear[eqns];

Clear[f0];

eqns={s1==f0/N, s2==f0/(N+1)};

Solve[eqns, {N, f0}]

{{n→s2/s1−s2,f0→s1s2/s1−s2}}

In the above equations, s1 and s2 are the signals measured, N is the divide ratio and $f_0$ is the frequency of interest. This computation is performed in step 205.

In step 206, the frequency of the VCO output is calculated from f1 and N, and in step 207, the values V and fv are stored in the table in memory 110. In step 208, a new value for V is selected. The new value for V can be an incrementally increased value from the previous value so as to step through the possible range of the driving voltage for the VCO 100. If the next value of V exceeds a predetermined limit, step 210 causes the process to stop at step 220. Otherwise, the process returns to step 202 and a new value for fv is calculated corresponding to the new voltage.

The process of FIG. 5 is repeated for different driving voltages for the VCO, until a range of different frequencies have been measured. When this process is completed, the calibration phase of operation is concluded.

The VCO 100 can now be switched into an operational phase or mode in which its output is supplied to an IF stage of a radio 150. The signal from the VCO is used as an injection signal for down-converting a received radio signal or up-converting a signal to be transmitted. A desired injection frequency can be selected by performing a look-up operation in the table in memory 110 and selecting an appropriate voltage to deliver the desired frequency.

The resultant control of the output frequency of the VCO 100 can be precise and accurate and can be adjusted over a wide range without losing precision. The need for an expensive synthesizer is eliminated.

The microprocessor 102 can perform interpolation between voltages in the table of memory 110, so that if a desired frequency lies between two values stored in the table of memory 110, linear interpretation between the corresponding voltages (or non-linear interpretation) can be performed to select an appropriate voltage to deliver the desired frequency. Similarly, extrapolation can be performed if the desired frequency falls outside the range of measured frequencies, provided that it is not so far outside the range of measured frequencies that it cannot be predicted from the frequencies and voltages measured.

Instead of selecting notches for the relaxation oscillator at which the divisor is N and N+1, other notches can be selected. For example, notches at which the relaxation oscillator divides by N and N+2 can be selected, in which case the necessary equation for step 205 is as follows:

eqns={s1==f0/N, s3==f0/(N+2)};

Solve[eqns, {N, f0}]

{{n→2s3/s1−s3,f0→2s1s3/s1−s3}}

This combination is less preferred, because there will be another notch in the characteristic of the relaxation oscillator that lies between the desired notches and there is a risk that the relaxation oscillator will jump to the intermediate notch unintentionally. The particular relationship between the P and Q values for the adjacent notches is not critical, provided that it is predetermined.

Figure 6:
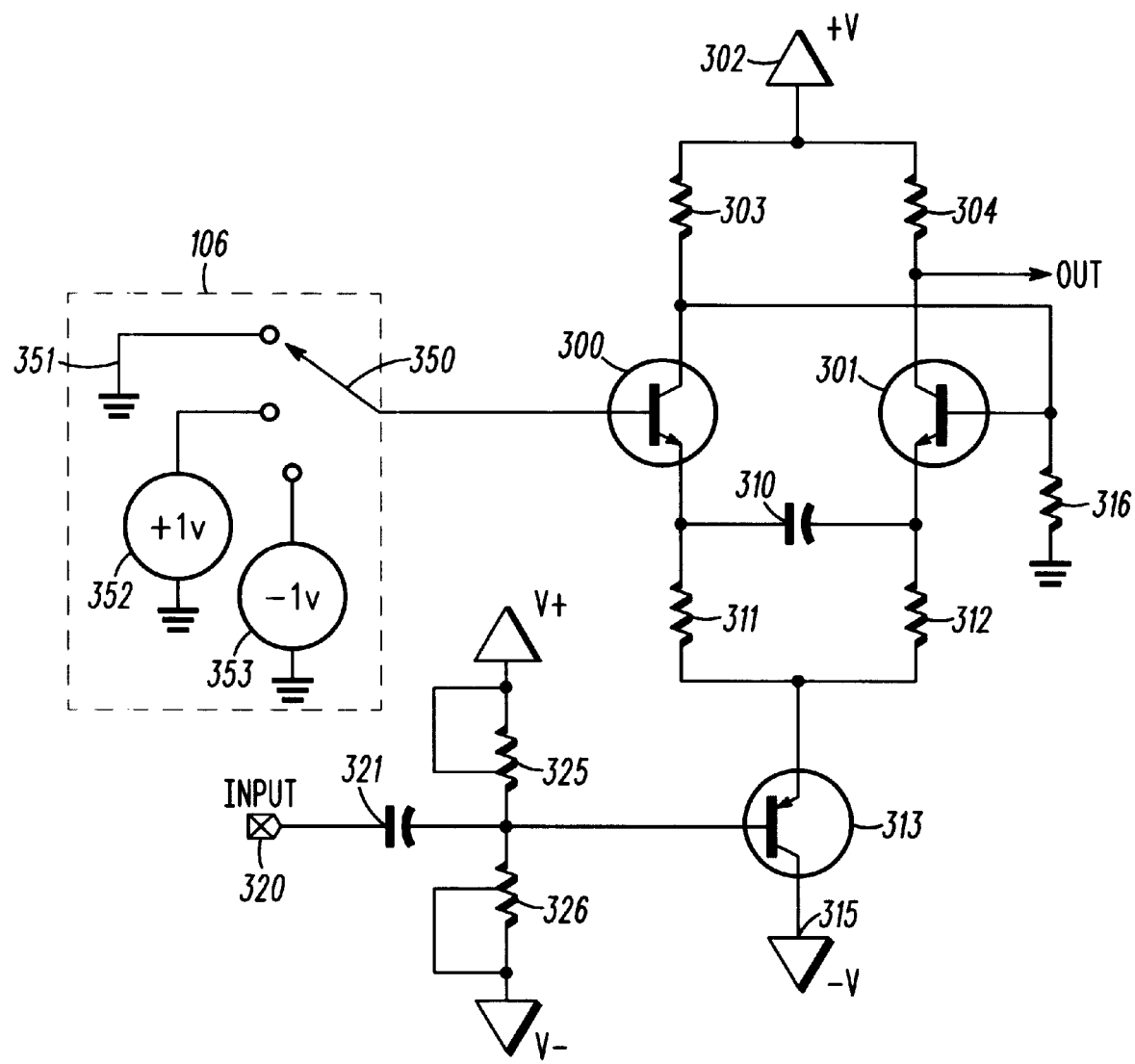

FIG. 6 shows an alternative relaxation oscillator that can be used in place of the oscillator of FIG. 1. It comprises a first transistor 300 and a second transistor 301, coupled to a 20-volt positive supply 302 via two resistors 303 and 304 respectively, each having a value of 470 ohms. The emitters of the two transistors are connected by a 10 nanofarad capacitor 310. The emitters are also connected via two resistors 311 and 312 to a third transistor 313 connected to a negative voltage source at −8 volts (voltage source 315). Resistor 311 has a value of 3.3k ohms and resistor 312 has a value of 4.7k ohms. The collector of transistor 300 is coupled to the base of transistor 301 and together they are coupled via a 470 ohm resistor 316 to ground. An input 320 is connected via a 1 microfarad capacitor 321 to the base of transistor 313. The base of that transistor is biased to the positive voltage supply via a 20k ohm adjustable resistor 325 and to the negative supply by another 20k ohm adjustable resistor 326, such that the base of transistor 313 is at approximately −5 volts.

In FIG. 6 a nudge circuit 106 is shown in more detail. In this example, the base of the transistor 300 is selectively coupled by a switching device 350 to either a ground connection 351 or a +1v source of voltage potential 352 or a −1v source of voltage potential. The switching device 350 is under control of a microprocessor.

The nudge circuit 106 causes the dividing oscillator (e.g. the relaxation oscillator) to operate selectively in a first mode in which the dividing oscillator frequency is a first fraction (e.g., 1/31) of the VCO frequency and in second mode in which the dividing oscillator frequency is a second fraction (e.g. 1/32) of the VCO frequency. The nudge circuit of FIG. 6 can cause the dividing oscillator to operate in a third mode in which the dividing oscillator frequency is a third fraction of the VCO frequency.

Figure 7:
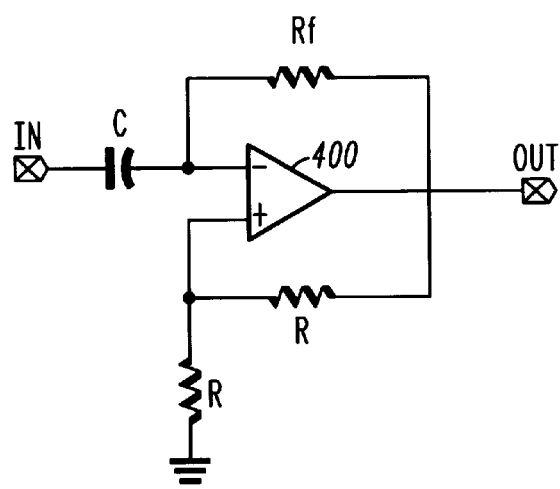
FIGS. 6 and 7 are circuit diagrams of alternative relaxation oscillators suitable for the invention.

Other forms of dividing oscillator may be used in place of the relaxation oscillator of FIG. 1. Examples are an operational amplifier 400 coupled as a relaxation oscillator as shown in FIG. 7. Other examples of dividing oscillators can be devised (not necessarily limited to relaxation oscillators) with simple experimentation by one of ordinary skill in the art given the teachings of the present invention.

Multiple dividing oscillators can be cascaded to divide the VCO frequency down in stages to a desired level for frequency measurement by a processor. One or several of the dividing oscillators in a cascade can have a nudge circuit for changing the total divide ratio.

The above description has been given by way of example only and modifications of detail can be made within the scope and spirit of the invention.

We claim:

1. A method of calibration of a voltage controlled oscillator (VCO) comprising:

providing a first input voltage to the VCO such that the VCO provides an output signal having a first VCO frequency, using the output signal of the VCO to drive a dividing oscillator in a first state in which the dividing oscillator provides a dividing oscillator output signal which has a first frequency that is related to the VCO output signal by a first ratio;

measuring the first frequency;

causing the dividing oscillator to enter a second state in which the dividing oscillator provides a dividing oscillator output signal which has a second frequency that is related to the VCO output signal by a second ratio;

measuring the second frequency; and from the first and second frequencies and the first and second ratios, calculating and storing the first VCO frequency.

2. The method of claim 1 wherein the first ratio and the second ratio represent adjacent notches in a frequency/coupling characteristic of the dividing oscillator.

3. The method of claim 1, further comprising:

storing a value for the first input voltage;

selecting a second input voltage for the VCO to provide an output signal having a second VCO frequency;

with the output signal having the second VCO frequency, driving the dividing oscillator in a third state in which the dividing oscillator provides a dividing oscillator output signal which has a third frequency that is related to the second VCO frequency by a third ratio;

measuring the third frequency;

causing the dividing oscillator to enter a fourth state in which the dividing oscillator provides a dividing oscillator output signal which has a fourth frequency that is related to the second VCO frequency by a fourth ratio;

measuring the fourth frequency;

from the third and fourth frequencies and the third and fourth ratios, calculating and storing the second VCO frequency; and storing the second input voltage.

4. The method of claim 3, wherein the first and third ratios are the same and the second and fourth ratios are the same.

5. The method of claim 3 further comprising interpolating between the first input voltage and the second input voltage and between the first VCO frequency and the second VCO frequency and applying to the VCO a voltage between the first and second input voltages to derive a frequency between the first and second VCO frequencies.

6. The method of claim 3 further comprising extrapolating beyond one of the first input voltage and the second input voltage and beyond one of the first VCO frequency and the second VCO frequency and applying to the VCO a voltage beyond one of the first and second input voltages to derive a frequency beyond one of the first and second VCO frequencies.

7. A method of operation of a radio comprising calibrating a voltage controlled oscillator (VCO) according to the method of claim 1 in a calibration mode;

switching to an operational mode; and using the output signal of the VCO as an injection signal for the radio.

8. An oscillator circuit comprising;

a voltage controlled oscillator (VCO) having an output providing a signal having a VCO frequency;

a dividing oscillator having an input coupled to the output of the VCO and having an output providing a second signal having a dividing oscillator frequency; and a nudge circuit coupled to the dividing oscillator causing the dividing oscillator to operate selectively in a first mode in which the dividing oscillator frequency is a first fraction of the VCO frequency and in second mode in which the dividing oscillator frequency is a second fraction of the VCO frequency.

9. The oscillator circuit of claim 8 further comprising a processor coupled to the output of the dividing oscillator and coupled to the nudge circuit, the processor having instructions that cause the processor to measure the dividing oscillator frequency in the first mode and in the second mode and to cause the dividing oscillator to switch between the first and second modes.

10. The oscillator circuit of claim 9, wherein the processor comprises further instructions that cause the processor to calculate the first VCO frequency from the dividing oscillator frequency in the first mode and in the second mode.

11. The oscillator circuit of claim 10, wherein the further instructions cause the processor to calculate the first VCO frequency from the dividing oscillator frequency in the first mode and in the second mode and from a predetermined relationship between the first fraction and the second fraction.

12. The oscillator circuit of claim 10, further comprising a memory coupled to the processor, the memory having stored therein a table of driving frequencies for the VCO and corresponding calculated VCO frequencies.

13. The oscillator circuit of claim 8, wherein the dividing oscillator is a relaxation oscillator.

14. A radio comprising the oscillator circuit of claim 8, wherein the output of the VCO provides an injection signal for the radio.

15. An integrated circuit comprising:

a dividing oscillator having an input for coupling to a voltage controlled oscillator (VCO) for receiving a signal having a VCO frequency, and an output providing an output signal having a dividing oscillator frequency; and a nudge circuit coupled to the dividing oscillator causing the dividing oscillator to operate selectively in a first mode in which the dividing oscillator frequency is a first fraction of the VCO frequency and in a second mode in which the dividing oscillator frequency is a second fraction of the VCO frequency.

16. The integrated circuit of claim 15, further comprising a voltage controlled oscillator coupled to the input of the dividing oscillator.

17. The integrated circuit of claim 15, wherein the dividing oscillator is a relaxation oscillator.

* * * * *